US009954158B2

(12) United States Patent
You et al.

(10) Patent No.: US 9,954,158 B2
(45) Date of Patent: Apr. 24, 2018

(54) METHOD AND DEVICE FOR REDUCING EXTRINSIC DARK COUNT OF NANOWIRE SINGLE PHOTON DETECTOR COMPRISING A MULTI-LAYER FILM FILTER

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Lixing You, Shanghai (CN); Hao Li, Shanghai (CN); Xiaoyan Yang, Shanghai (CN); Weijun Zhang, Shanghai (CN); Zhen Wang, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 28 days.

(21) Appl. No.: 15/126,125

(22) PCT Filed: May 12, 2014

(86) PCT No.: PCT/CN2014/077204
§ 371 (c)(1),
(2) Date: Sep. 14, 2016

(87) PCT Pub. No.: WO2015/139361
PCT Pub. Date: Sep. 24, 2015

(65) Prior Publication Data
US 2017/0098752 A1 Apr. 6, 2017

(30) Foreign Application Priority Data
Mar. 20, 2014 (CN) .......................... 2014 1 0106302

(51) Int. Cl.
*G01J 1/44* (2006.01)
*H01L 39/16* (2006.01)
(Continued)

(52) U.S. Cl.
CPC ................ *H01L 39/16* (2013.01); *G01J 1/44* (2013.01); *G01J 2001/442* (2013.01);
(Continued)

(58) Field of Classification Search
CPC ... H01L 31/02165; H01L 31/09; H01L 39/16; G01J 1/44; G01J 2001/442
(Continued)

(56) References Cited

U.S. PATENT DOCUMENTS 9,500,519 B2 * 11/2016 Tang ..................... G01J 1/0425

FOREIGN PATENT DOCUMENTS

CN 101276821 A 10/2008
CN 101997054 A 3/2011

* cited by examiner

*Primary Examiner* — Que T Le
(74) *Attorney, Agent, or Firm* — Global IP Services; Tianhua Gu

(57) ABSTRACT

A method and a device for reducing the extrinsic dark count of a superconducting nanowire single photon detector (SNSPD), it comprises the steps of: integrating a multi-layer film filter on the superconducting nanowire single photon detector; the multi-layer film filter is a device implemented by a multi-layer dielectric film and having a band-pass filtering function. The extrinsic dark count is the dark count triggered by optical fiber blackbody radiance and external stray light. The superconducting nanowire single photon detector comprises: a substrate having an upper surface integrated with an upper anti-reflection layer and a lower surface integrated with a lower anti-reflection layer; an optical cavity structure; a superconducting nanowire; and a (Continued)

reflector. The present invention is easy to operate, and only needs to integrate the multi-layer film filter on the substrate of the SNSPD to filter non-signal radiation.

9 Claims, 3 Drawing Sheets

(51) Int. Cl.
    *H01L 39/02*         (2006.01)
    *H01L 31/0232*     (2014.01)
    *H01L 31/0216*     (2014.01)
    *H01L 31/09*         (2006.01)

(52) U.S. Cl.
    CPC .. *H01L 31/02165* (2013.01); *H01L 31/02327* (2013.01); *H01L 31/09* (2013.01); *H01L 39/02* (2013.01)

(58) Field of Classification Search
    USPC ..................................... 250/214.1, 226, 239
    See application file for complete search history.

METHOD AND DEVICE FOR REDUCING EXTRINSIC DARK COUNT OF NANOWIRE SINGLE PHOTON DETECTOR COMPRISING A MULTI-LAYER FILM FILTER

CROSS REFERENCE TO RELATED PATENT APPLICATION

The present application is the US national stage of PCT/CN2014/077204 filed on May 12, 2014, which claims the priority of the Chinese patent application No. 201410106302.7 filed on Mar. 20, 2014, which applications are incorporated herein by reference.

BACKGROUND OF THE PRESENT INVENTION

Field of Invention

The present invention belongs to a technical field of optical detection, and particularly relates to a method and a device for reducing the extrinsic dark count of a superconducting nanowire single photon detector.

Description of Related Arts

A superconducting nanowire single photon detector (SNSPD) is an important photodetector, which may achieve a single photon detection from a visible wavelength band to an infrared wavelength band. The SNSPD mainly adopts a low temperature superconducting ultrathin film material, e.g., NbN, Nb, TaN, NbTiN, WSi and the like, with a typical thickness of 5-10 nm; the device usually adopts a zigzag nanowire with a width of about 100 nm. An existing superconducting nanowire single photon detector structure is shown in FIG. 1, comprising substrates 20-40 having an upper surface and a lower surface with an anti-reflection layer respectively, an optical cavity structure 50, a superconducting nanowire 60 and a reflector 70, etc.

When in use, the SNSPD is placed in a low temperature environment (<4 k), and the device is in the superconductive state, further, the device is applied with a certain bias current $I_b$, which is slightly less than the critical current $I_c$ of the device. Once single photons incident on the nanowire of the device, cooper-pairs are broken for generating a large amount of thermal electrons to form a local hotspot, which is further diffused due to Joule heat under the action of the bias current $I_b$, with the result that a part of the nanowire is quenched to form a resistance area. After that, the thermal electrons are transferred and relaxed by electron-phonon interactions, and are further re-paired as cooper-pairs of superconducting state. Since the superconducting material has a short thermal relaxation time, after the SNSPD receives a single photon, it may generate fast electrical pulse signals at two ends of the device, so as to achieve the detection function of the single photons.

Dark count is one of the main parameters of the single photon detector. It refers to the error count that is irrelevant to signale photons. The dark count of the SNSPD is derived from two aspects: one is the dark count caused by a magnetic vortex motion of the SNSPD nanowire, which is called as an intrinsic dark count; the intrinsic dark count is relevant to the working current of the device and is generated only if the working current is very close to the critical current, with a counting rate thereof being exponentially dependent on the bias current. The count of the SNSPD triggered by other non-signal photons are commonly called as the extrinsic dark count, which may come from probabilities as below: (1) the dark count caused by thermal radiation of the optical fiber material per se; (2) when the SNSPD is in use, a small amount of various optical (heat) radiations in the working environment may enter the optical fiber through a coating layer thereof as a SNSPD count triggered by stray light. The extrinsic dark count may equivalent to a certain amount of photon radiation, with an introduced dark count being proportional to detection efficiency of the detector. The dark count is crucial to many applications of single photon detections, especially, the level of the dark count is a key parameter determining signal-to-noise ratio of coding and communication distance as for a long-distance fiber quantum communication. Currently, there is no efficient method for thoroughly solving the intrinsic dark count, and it usually adopts an approach reducing the bias current of the SNSPD in the prior art. Under such conditions, the extrinsic dark count plays a decisive role. Shibata et. al in Japan have proposed a method that introduces an optical fiber filter in an optical fiber at low temperature, which may efficiently reduce the extrinsic dark count, but still, significantly attenuate signal light (for about 3 dB), which directly affects the detection efficiency of the device.

SUMMARY OF THE PRESENT INVENTION

In view of the above disadvantages in the prior art, an object of the present invention is to provide a method and a device for reducing the extrinsic dark count of a superconducting nanowire single photon detector, so as to solve the problem in the prior art that performance of the nanowire single photon detector is decreased due to the extrinsic dark count.

In order to achieve the above object and other related objects, the present invention provides a method for reducing the extrinsic dark count of the superconducting nanowire single photon detector, comprising the steps of:

integrating a multi-layer film filter on the superconducting nanowire single photon detector;

wherein, the multi-layer film filter is a device implemented by a multi-layer dielectric film and having a band-pass filtering function.

As a preferable technical solution of the method for reducing the extrinsic dark count of the superconducting nanowire single photon detector according to the present invention, the extrinsic dark count is the dark count triggered by optical fiber blackbody radiance and external stray light.

As a preferable technical solution of the method for reducing the extrinsic dark count of the superconducting nanowire single photon detector according to the present invention, the superconducting nanowire single photon detector comprises:

a substrate bonded with a surface of the multi-layer film filter, wherein the substrate has an upper surface bonded with an upper anti-reflection layer and a lower surface bonded with a lower anti-reflection layer;

an optical cavity structure bonded with a surface of the upper anti-reflection layer of the substrate;

a superconducting nanowire bonded between the upper anti-reflection layer of the substrate and the optical cavity structure;

a reflector bonded with a surface of the optical cavity structure.

Further, the substrate is a silicon substrate, MgO substrate or sapphire substrate, the material of the optical cavity structure is silicon dioxide or silicon monoxide, the material of the upper anti-reflection layer and the lower anti-reflection layer is silicon dioxide or silicon monoxide, the material of the superconducting nanowire is NbN, Nb, TaN, NbTiN or WSi, the material of the reflector is Ag, Au or Al, etc.

As a preferable technical solution of the method for reducing the extrinsic dark count of the superconducting nanowire single photon detector according to the present invention, the multi-layer film filter comprises one of alternately stacked silicon dioxide layers and silicon layers, alternately stacked silicon monoxide layers and silicon layers, or alternately stacked silicon dioxide layers and silicon monoxide layers.

The present invention further provides a superconducting nanowire single photon detector integrated with a multi-layer film filter, comprising:

a superconducting nanowire single photon detector;

a multi-layer film filter integrated to the superconducting nanowire single photon detector, wherein the multi-layer film filter is a device implemented by a multi-layer dielectric film and having a band-pass filtering function.

As a preferable technical solution of the superconducting nanowire single photon detector integrated with the multi-layer film filter, the superconducting nanowire single photon detector comprises:

a substrate bonded with a surface of the multi-layer film filter, wherein the substrate has an upper surface bonded with an upper anti-reflection layer and a lower surface bonded with a lower anti-reflection layer;

an optical cavity structure bonded with a surface of the upper anti-reflection layer of the substrate;

a superconducting nanowire bonded between the upper anti-reflection layer of the substrate and the optical cavity structure;

a reflector bonded with a surface of the optical cavity structure.

As a preferable technical solution of the superconducting nanowire single photon detector integrated with the multi-layer film filter, the substrate is a silicon substrate, MgO substrate or sapphire substrate, the material of the optical cavity structure is silicon dioxide or silicon monoxide, the material of the upper anti-reflection layer and the lower anti-reflection layer is silicon dioxide or silicon monoxide, the material of the superconducting nanowire is NbN, Nb, TaN, NbTiN or WSi, the material of the reflector is Ag, Au or Al, etc.

As a preferable technical solution of the superconducting nanowire single photon detector integrated with the multi-layer film filter, the multi-layer film filter comprises one of alternately stacked silicon dioxide layers and silicon layers, alternately stacked silicon monoxide layers and silicon layers or alternately stacked silicon dioxide layers and silicon monoxide layers.

From the above, the present invention provides a method and a device for reducing the extrinsic dark count of a superconducting nanowire single photon detector, comprising the steps of: integrating a multi-layer film filter on the superconducting nanowire single photon detector; wherein, the multi-layer film filter is a device implemented by a multi-layer dielectric film and having a band-pass filtering function. The extrinsic dark count is the dark count triggered by optical fiber blackbody radiance and external stray light. The superconducting nanowire single photon detector comprises: a substrate bonded with a surface of the multi-layer film filter, wherein the substrate has an upper surface bonded with an upper anti-reflection layer and a lower surface bonded with a lower anti-reflection layer; an optical cavity structure bonded with a surface of the upper anti-reflection layer of the substrate; a superconducting nanowire bonded between the upper anti-reflection layer of the substrate and the optical cavity structure; a reflector bonded with a surface of the optical cavity structure. The present invention is easy to operate, and only needs to integrate the multi-layer film filter on the substrate of the SNSPD to filter non-signal radiation. The method effectively reduces the extrinsic dark count while ensuring the signal radiation and the optical coupling efficiency of a device, thereby improving the detection efficiency of the device in dark count specific conditions.

Figure 1:
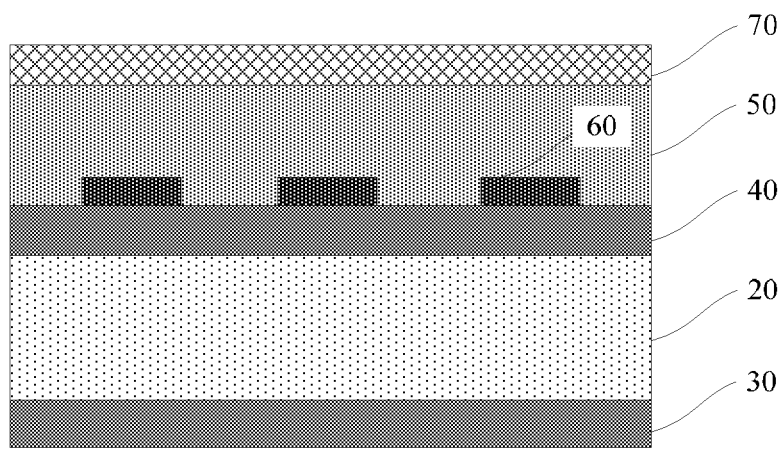
FIG. 1 shows a structure diagram of an existing superconducting nanowire single photon detector in the prior art.

DESCRIPTION OF COMPONENT REFERENCE SIGNS 10 multi-layer film filter
101 silicon dioxide layer
102 silicon layer
20 substrate
30 lower anti-reflection layer
40 upper anti-reflection layer
50 optical cavity structure
60 superconducting nanowire
70 reflector

DETAILED DESCRIPTION OF THE PREFERRED EMBODIMENTS

The embodiments of the present invention will be described below through specific examples. One skilled in the art can easily understand other advantages and effects of the present invention according to the contents disclosed by the description. The present invention can also be implemented or applied through other different specific embodiments. Various modifications or variations can be made to all details in the description based on different points of view and applications without departing from the spirit of the present invention.

Please refer to FIGS. 1 to 6. It needs to be noted that the drawings provided in this embodiment are just used for exemplarily describing the basic concept of the present invention, thus the drawings only show components related to the present invention but are not drawn according to component numbers, shapes and sizes during actual implementation, the patterns, numbers and proportions of all components can be randomly changed during actual implementation, and the component layout patterns can also be more complex.

Figure 2:
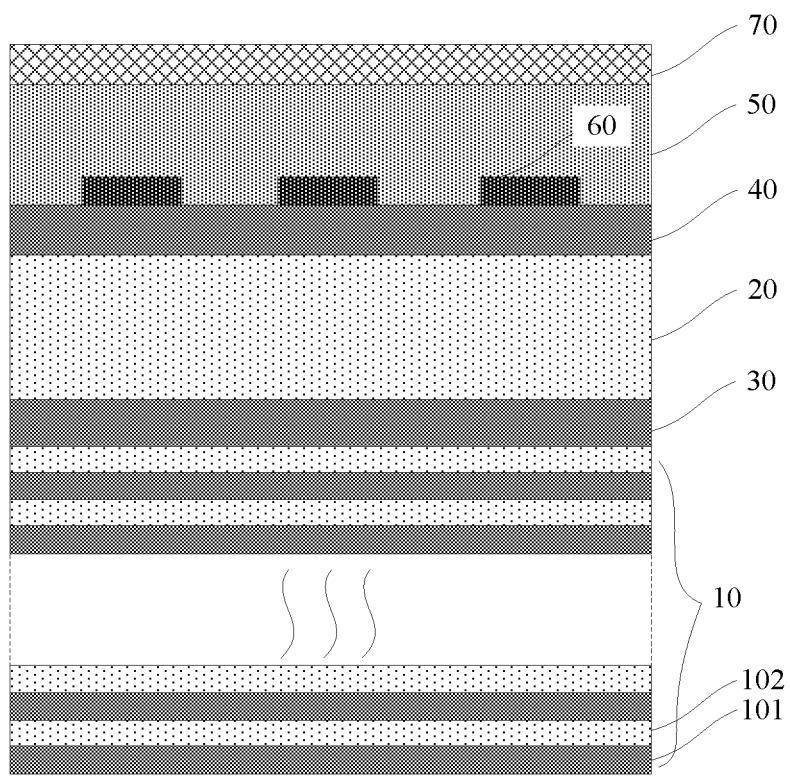
FIG. 2 shows a structure diagram of a superconducting nanowire single photon detector integrated with a multi-layer film filter according to the present invention.

As shown in FIGS. 1 and 2, the present embodiment provides a method for reducing the extrinsic dark count of the superconducting nanowire single photon detector, comprising the steps of:

integrating a multi-layer film filter 10 on the superconducting nanowire single photon detector;

wherein, the multi-layer film filter 10 is a device implemented by a multi-layer dielectric film and having a band-pass filtering function.

As an example, the extrinsic dark count is the dark count triggered by optical fiber blackbody radiance and external stray light and the like.

As an example, the superconducting nanowire single photon detector comprises:

a substrate 20 bonded with the surface of the multi-layer film filter 10, wherein the substrate 20 has an upper surface bonded with an upper anti-reflection layer 40 and a lower surface bonded with a lower anti-reflection layer 30;

an optical cavity structure 50 bonded with a surface of the upper anti-reflection layer 40 of the substrate 20;

a superconducting nanowire 60 bonded between the upper anti-reflection layer 40 of the substrate 20 and the optical cavity structure 50;

a reflector 70 bonded with a surface of the optical cavity structure 50.

Further, the material of the optical cavity structure 50 is silicon dioxide or silicon monoxide, the upper anti-reflection layer 40 and the lower anti-reflection layer 30 are silicon dioxide, the substrate 20 is silicon substrate, MgO substrate or sapphirine substrate, the material of the upper anti-reflection layer 40 and the lower anti-reflection layer 30 is silicon dioxide or silicon monoxide, the material of the superconducting nanowire 60 is NbN, Nb, TaN, NbTiN or WSi, the material of the reflector 70 is Ag, Au or Al, etc. Certainly, the above examples are several preferable solutions of the present invention, while in other embodiments, other material types are also suitable, thus it is not limited to the above listed examples.

In the present embodiment, the material of the optical cavity structure 50 is silicon monoxide, and the thickness thereof is one fourth of the wavelength of the light detected by the device.

The material of the superconducting nanowire 60 is NbN; the superconducting nanowire 60 has a width of 100 nm, a thickness of 7 nm, a cycle of 200 nm, and has a zigzag structure. Certainly, in other embodiments, the material, size and shape of the superconducting nanowire 60 may be changed as actual requirement, but not limited thereto.

The material of the reflector 70 is Ag, and the reflector 70 has a thickness of 130 nm. Certainly, other types of reflecting material and thickness may also be suitable for the present invention, and are not limited thereto. Besides, the above superconducting nanowire single photon detector is only one preferable manner of the present embodiment, and the multi-layer film filter 10 in the present embodiment is also suitable for the superconducting nanowire single photon detector with other structures.

As an example, the multi-layer film filter 10 comprises one of alternately stacked silicon dioxide layers 101 and silicon layers 102, alternately stacked silicon monoxide layers and silicon layers, or alternately stacked silicon dioxide layers and silicon monoxide layers. In the present embodiment, the multi-layer film filter 10 comprises alternately stacked silicon dioxide layers 101 and silicon layers 102, wherein, there are 16 layers of silicon dioxide layers 101 and 16 layers of silicon layers 102, i.e., a multi-layer film of 32 layers. Certainly, in other embodiments, other types of multi-layer films with band-pass filtering function are also suitable.

As shown in FIG. 2, the present embodiment further provides a superconducting nanowire single photon detector integrated with the multi-layer film filter 10, comprising:

a superconducting nanowire single photon detector;

a multi-layer film filter 10 integrated to the superconducting nanowire single photon detector, wherein the multi-layer film filter 10 is a device implemented by a multi-layer dielectric film and having a band-pass filtering function.

As an example, the superconducting nanowire single photon detector comprises:

a substrate 20 bonded with a surface of the multi-layer film filter 10, wherein the substrate 20 has an upper surface bonded with an upper anti-reflection layer 40 and a lower surface bonded with a lower anti-reflection layer 30;

an optical cavity structure 50 bonded with a surface of the upper anti-reflection layer 40 of the substrate 20;

a superconducting nanowire 60 bonded between the upper anti-reflection layer 40 of the substrate 20 and the optical cavity structure 50;

a reflector 70 bonded with a surface of the optical cavity structure 50.

Further, the material of the optical cavity structure 50 is silicon dioxide or silicon monoxide, the substrate 20 is a silicon substrate, MgO substrate or sapphirine substrate, the material of the upper anti-reflection layer 40 and the lower anti-reflection layer 30 is silicon dioxide or silicon monoxide, the material of the superconducting nanowire 60 is NbN, Nb, TaN, NbTiN or WSi, the material of the reflector 70 is Ag, Au or Al, etc. Certainly, the above examples are several preferable solutions of the present invention, while in other embodiments other material types are also suitable, thus it is not limited to the above listed examples.

In the present embodiment, the material of the optical cavity structure 50 is silicon monoxide, and the thickness thereof is one fourth of the wavelength of the light detected by the device.

The material of the superconducting nanowire 60 is NbN; the superconducting nanowire 60 has a width of 100 nm, a thickness of 7 nm, a cycle of 200 nm, and has a zigzag structure. Certainly, in other embodiments, the material, size and shape of the superconducting nanowire 60 may be changed as actual requirement, but not limited thereto.

The material of the reflector 70 is Ag, and the reflector 70 has a thickness of 130 nm. Certainly, other types of reflecting material and thickness may also be suitable for the present invention, and are not limited thereto. Besides, the above superconducting nanowire single photon detector is only one preferable manner of the present embodiment, and the multi-layer film filter 10 in the present embodiment is also suitable for the superconducting nanowire single photon detector with other structures, but is not limited thereto.

As an example, the multi-layer film filter 10 comprises one of alternately stacked silicon dioxide layers 101 and silicon layers 102, alternately stacked silicon monoxide layers and silicon layers, or alternately stacked silicon dioxide layers and silicon monoxide layers. In the present embodiment, the multi-layer film filter 10 comprises alternately stacked silicon dioxide layers 101 and silicon layers 102, wherein, there are 16 layers of silicon dioxide layers 101 and 16 layers of silicon layers 102, i.e., a multi-layer thin film of 32 layers. Certainly, in other embodiments, other types of multi-layer films with band-pass filtering function are also suitable, but not limited thereto.

Moreover, as shown in FIGS. 3 to 6, performance measurements of the superconducting nanowire single photon detector integrated with the multi-layer film filter 10 according to the present invention are carried out in the embodiment as below:

1) Effect of the Multi-Layer Film Filter 10 in the Present Embodiment on the Device Efficiency.

Figure 3:
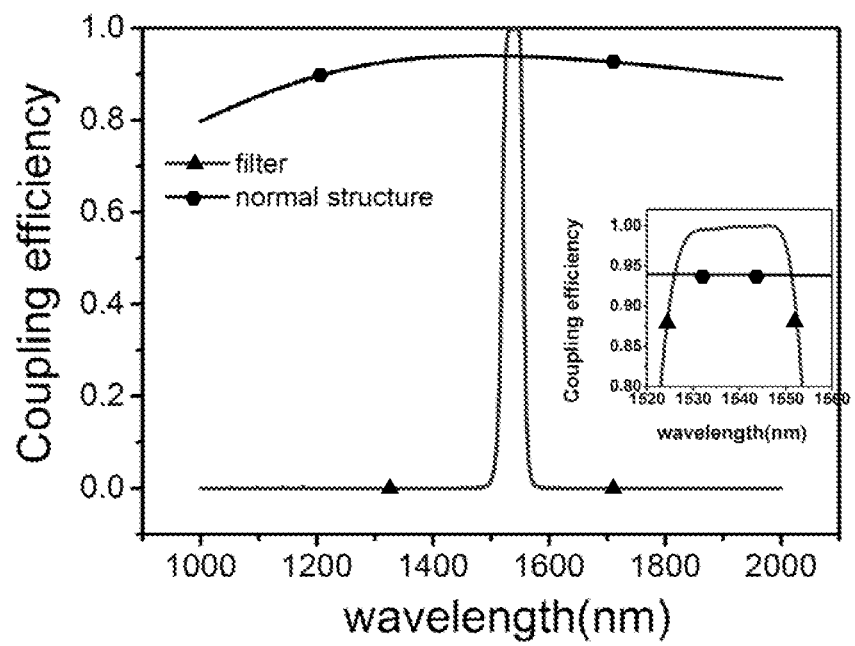
FIG. 3 shows theoretical wavelength-coupling efficiency curve graphs of the existing SNSPD (normal structure) and the superconducting nanowire single photon detector integrated with the multi-layer film filter, SNSPD (filter), according to the present invention respectively, wherein an inset illustration in the figure refers to an enlarged view at a wavelength of 1550 nm.
Figure 4:
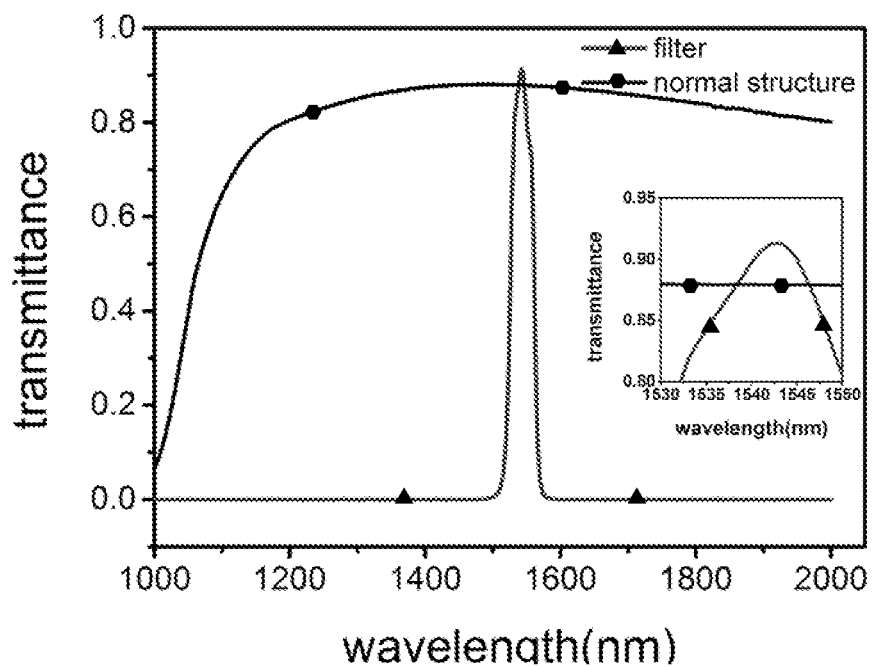
FIG. 4 shows actual measured wavelength-transmissivity curve graphs of the existing SNSPD (normal structure) and the SNSPD with the multi-layer film filter (filter) according to the present invention, wherein, an inset illustration in the figure refers to an enlarged view at a wavelength of 1550 nm.

In the present embodiment, the adopted multi-layer film filter 10 comprises alternately stacked silicon dioxide layers 101 and silicon layers 102, wherein, there are 16 layers of silicon dioxide layers 101 and 16 layers of silicon layers, i.e., a multi-layer film of 32 layers, to obtain the multi-layer film structure as shown in FIG. 2. Wherein, refractive indexes of the silicon and the silicon dioxide are 3.56 and 1.47, respectively. A conventional superconducting nanowire single photon detector (SNSPD) is usually deposited with an anti-reflection layer at the bottom of a substrate to improve light within the required wave band, but still, light is partly lost due to the matching problem of refractive indexes. FIG. 3 shows theoretical wavelength-coupling efficiency curve graphs of a normal SNSPD (normal structure) and the SNSPD with the multi-layer film filter 10 (filter) of the present invention, respectively. As shown in FIG. 3, by the multi-layer film of the present embodiment, almost 100% of light is coupled in the device theoretically, while light with other frequencies is filtered, thereby the effect of external background light on the device is inhibited. FIG. 4 shows actual measured wavelength-transmissivity curve graphs of a normal SNSPD (normal structure) and the SNSPD with the multi-layer film filter 10 (filter) of the present invention, respectively. It can be seen from FIG. 4 that, as compared to the normal structure, the multi-layer film filter 10 designed in the present embodiment has better band-pass effect at 1550 nm. While as for the detection efficiency of the device, since there is a certain distribution among the detection efficiencies of each device, it is unable to directly compare the detection efficiency. However, it also can be seen from the results of FIG. 4 that, as compared to a conventional dual-sided oxide substrate, the multi-layer film structure enables to effectively improve the coupling efficiency at a designed wave band, so as to improve quantum efficiency of the device.

2) Effect of the Multi-Layer Film Filter 10 Integrated on the SNSPD Device on the Dark Count.

Figure 5:
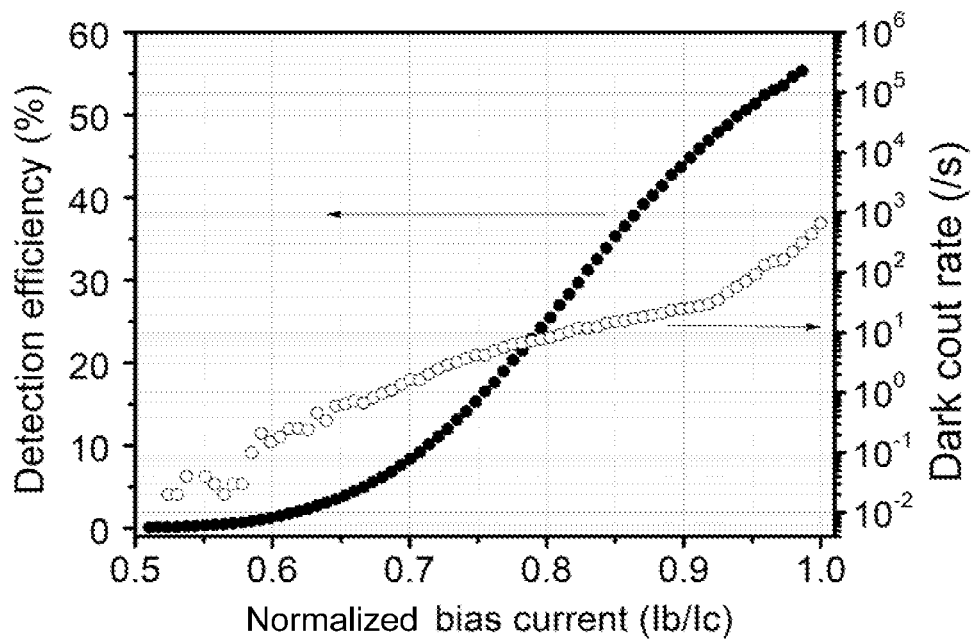
FIG. 5 is a diagram showing bias current-coupling efficiency and bias current-dark count of the existing SNSPD device (normal structure).
Figure 6:
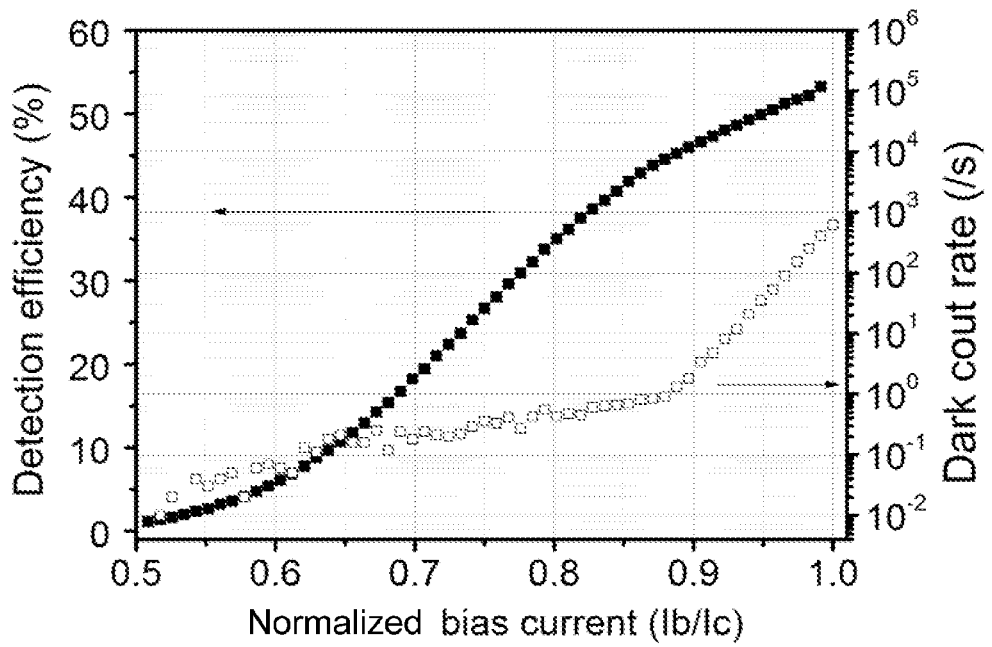
FIG. 6 is a diagram showing bias current-coupling efficiency and bias current-dark count of the superconducting nanowire single photon detector integrated with the multi-layer film filter in the present embodiment.

The multi-layer film filter 10 is integrated on the SNSPD device, to achieve the SNSPD device as shown in FIG. 2. Under the condition that the bias current is relative low, the dark count is greatly inhibited, as shown in FIGS. 5 and 6. Wherein, FIG. 5 is a diagram showing bias current-coupling efficiency and bias current-dark count of a conventional SNSPD device (normal structure). FIG. 6 is a diagram showing bias current-coupling efficiency and bias current-dark count place of the superconducting nanowire single photon detector integrated with the multi-layer film filter 10. It can be seen from the comparison of the two figures that, under the condition that the bias current is relative low, as compared to the conventional SNSPD device, the dark count of the superconducting nanowire single photon detector integrated with the multi-layer film filter 10 of the present embodiment is better inhibited.

From the above, the present invention provides a method and a device for reducing the extrinsic dark count of the superconducting nanowire single photon detector, comprising the steps of: integrating the multi-layer film filter 10 on the superconducting nanowire single photon detector; wherein, the multi-layer film filter 10 is the device implemented by the multi-layer dielectric film and having the band-pass filtering function. The extrinsic dark count is the dark count triggered by optical fiber blackbody radiance and external stray light. The superconducting nanowire single photon detector comprises: the substrate 20 bonded with the surface of the multi-layer film filter 10, wherein the substrate 20 has the upper surface bonded with the upper anti-reflection layer 40 and a lower surface bonded with the lower anti-reflection layer 30; the optical cavity structure 50 bonded with the surface of the upper anti-reflection layer 40 of the substrate 20; the superconducting nanowire 60 bonded between the upper anti-reflection layer 40 of the substrate 20 and the optical cavity structure 50; the reflector 70 bonded with a surface of the optical cavity structure 50. The present invention is easy to operate, and only needs to integrate the multi-layer film filter on the substrate of the SNSPD to filter non-signal radiation. The method effectively reduces the extrinsic dark count while ensuring the signal radiation and the optical coupling efficiency of a device, thereby improving the detection efficiency of the device in dark count specific conditions. Therefore, the present invention effectively overcomes all kinds of disadvantages in the prior art and has a great industrial utilization value.

The above-mentioned embodiments are just used for exemplarily describing the principle and effect of the present invention instead of limiting the present invention. One skilled in the art can make modifications or variations to the above-mentioned embodiments without departing from the spirit and the range of the present invention. Therefore, all equivalent modifications or variations made by those who have common knowledge in the art without departing from the spirit and technical concept disclosed by the present invention shall be still covered by the claims of the present invention.

What is claimed is:

1. A method for reducing an extrinsic dark count of a superconducting nanowire single photon detector, characterized in that, comprising steps of:
   integrating a multi-layer film filter on the superconducting nanowire single photon detector;
   wherein, the multi-layer film filter is a device implemented by a multi-layer dielectric film and having a band-pass filtering function.

2. The method for reducing the extrinsic dark count of the superconducting nanowire single photon detector as in claim 1, wherein, the extrinsic dark count is the dark count triggered by optical fiber blackbody radiance and external stray light.

3. The method for reducing the extrinsic dark count of the superconducting nanowire single photon detector as in claim 1, wherein, the superconducting nanowire single photon detector comprises:
   a substrate bonded with a surface of the multi-layer film filter, wherein the substrate has an upper surface bonded with an upper anti-reflection layer and a lower surface bonded with a lower anti-reflection layer;
   an optical cavity structure bonded with a surface of the upper anti-reflection layer of the substrate;
   a superconducting nanowire bonded between the upper anti-reflection layer of the substrate and the optical cavity structure;
   a reflector bonded with a surface of the optical cavity structure.

4. The method for reducing the extrinsic dark count of the superconducting nanowire single photon detector as in claim 3, wherein, the substrate is a silicon substrate, MgO substrate or sapphire substrate, the material of the optical cavity structure is silicon dioxide or silicon monoxide, the material of the upper anti-reflection layer and the lower anti-reflection layer is silicon dioxide or silicon monoxide, the material of the superconducting nanowire is NbN, Nb, TaN, NbTiN or WSi, the material of the reflector is Ag, Au or Al.

5. The method for reducing the extrinsic dark count of the superconducting nanowire single photon detector as in claim 1, wherein, the multi-layer film filter comprises one of alternately stacked silicon dioxide layers and silicon layers, alternately stacked silicon monoxide layers and silicon layers, or alternately stacked silicon dioxide layers and silicon monoxide layers.

6. A superconducting nanowire single photon detector integrated with a multi-layer film filter, characterized in that, comprising:
    a superconducting nanowire single photon detector;
    a multi-layer film filter integrated on the superconducting nanowire single photon detector, wherein the multi-layer film filter is a device implemented by a multi-layer dielectric film and having a band-pass filtering function.

7. The superconducting nanowire single photon detector integrated with the multi-layer film filter as in claim 6, wherein, the superconducting nanowire single photon detector comprises:
    a substrate bonded with a surface of the multi-layer film filter, wherein the substrate has an upper surface bonded with an upper anti-reflection layer and a lower surface bonded with a lower anti-reflection layer;
    an optical cavity structure bonded with a surface of the upper anti-reflection layer of the substrate;
    a superconducting nanowire bonded between the upper anti-reflection layer of the substrate and the optical cavity structure;
    a reflector bonded with a surface of the optical cavity structure.

8. The superconducting nanowire single photon detector integrated with the multi-layer film filter as in claim 7, wherein, the substrate is a silicon substrate, MgO substrate or a sapphire substrate, the material of the optical cavity structure is silicon dioxide or silicon monoxide, the material of the upper anti-reflection layer and the lower anti-reflection layer is silicon dioxide or silicon monoxide, the material of the superconducting nanowire is NbN, Nb, TaN, NbTiN or WSi, the material of the reflector is Ag, Au or Al.

9. The superconducting nanowire single photon detector integrated with the multi-layer film filter as in claim 6, wherein, the multi-layer film filter comprises one of alternately stacked silicon dioxide layers and silicon layers, alternately stacked silicon monoxide layers and silicon layers, or alternately stacked silicon dioxide layers and silicon monoxide layers.

* * * * *